(12) United States Patent
Lim et al.

(10) Patent No.: US 8,315,056 B2
(45) Date of Patent: Nov. 20, 2012

(54) HEAT-RADIATING SUBSTRATE AND METHOD OF MANUFACTURING THE SAME

(75) Inventors: Chang Hyun Lim, Seoul (KR); Jung Eun Kang, Gyunggi-do (KR); Seog Moon Choi, Gyunggi-do (KR); Kwang Soo Kim, Gyunggi-do (KR); Sung Keun Park, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 173 days.

(21) Appl. No.: 12/884,058

(22) Filed: Sep. 16, 2010

(65) Prior Publication Data
US 2011/0304990 A1 Dec. 15, 2011

(30) Foreign Application Priority Data
Jun. 14, 2010 (KR) .................. 10-2010-0056029

(51) Int. Cl.
*H05K 7/20* (2006.01)
*H05K 1/03* (2006.01)

(52) U.S. Cl. ........ 361/717; 361/704; 361/719; 361/720; 361/748; 361/750; 361/762; 174/252; 174/255; 174/256; 257/711; 257/713; 257/758; 29/611; 29/829; 29/846; 205/171; 205/172; 205/199; 156/150; 156/247; 156/257; 156/305

(58) Field of Classification Search ............ 361/679.46, 361/679.54, 704–712, 717–722, 748, 750, 361/751, 762, 746, 792–795; 174/252–260; 257/700–727, 758, 763–768, 686, 698, 774, 257/771, E23.019, E23.103, E23.145, E21.019; 29/825–856, 611; 428/209, 613–629, 650; 205/105, 106, 171, 172, 199; 156/150, 60, 156/247, 248, 257, 305
See application file for complete search history.

(56) References Cited

U.S. PATENT DOCUMENTS
3,514,538 A * 5/1970 Chadwick et al. ............ 174/257
(Continued)

FOREIGN PATENT DOCUMENTS
JP 63-219196 A 12/1988
(Continued)

OTHER PUBLICATIONS

Korean-language Office Action dated Jun. 3, 2001 for the related Korean Patent Application No. 10-2010-0056029.
(Continued)

*Primary Examiner* — Michail V Datskovskiy
(74) *Attorney, Agent, or Firm* — Ladas & Parry, LLP

(57) ABSTRACT

Disclosed herein are a heat-radiating substrate and a method of manufacturing the same. The heat-radiating substrate includes: a core layer including a core metal layer and a core insulating layer formed on the core metal layer and divided into a first region and a second region; a circuit layer formed in the first region of the core layer; a build-up layer formed in the second region of the core layer and including a build-up insulating layer and a build-up circuit layer; an adhesive layer formed between the second region of the core layer and the build-up layer; and an impregnation device mounted on the build-up layer to be impregnated into the adhesive layer. A heat generating element is mounted on the circuit layer and a thermally weakened element is mounted on the build-up layer, thereby preventing the thermally weakened element from being damaged by heat of the heat generating element. The impregnation device is formed on the build-up layer and is impregnated into the adhesive layer, thereby efficiently utilizing a space.

10 Claims, 8 Drawing Sheets

U.S. PATENT DOCUMENTS

| | | | | |
|---|---|---|---|---|
| 4,495,378 | A * | 1/1985 | Dotzer et al. | 174/252 |
| 5,305,186 | A * | 4/1994 | Appelt et al. | 361/704 |
| 5,688,606 | A * | 11/1997 | Mahulikar et al. | 428/615 |
| 6,459,047 | B1 * | 10/2002 | Japp et al. | 174/256 |
| 7,875,340 | B2 * | 1/2011 | Cho et al. | 428/209 |
| 8,061,025 | B2 * | 11/2011 | Cho et al. | 29/846 |
| 8,165,429 | B2 * | 4/2012 | Lee et al. | 385/14 |
| 2009/0297801 | A1 | 12/2009 | Cho et al. | 428/209 |
| 2010/0294543 | A1 * | 11/2010 | Sohn et al. | 174/252 |
| 2010/0307800 | A1 * | 12/2010 | Wee et al. | 174/257 |

FOREIGN PATENT DOCUMENTS

| | | |
|---|---|---|
| JP | 5-37105 A | 2/1993 |
| JP | 2004-179291 | 6/2004 |
| JP | 2005-93598 A | 4/2005 |
| JP | 2009-108386 | 5/2009 |

OTHER PUBLICATIONS

Office Action for related Japanese App. No. 2010-204671 dated May 15, 2012, and its English summary provided by the client.

* cited by examiner

HEAT-RADIATING SUBSTRATE AND METHOD OF MANUFACTURING THE SAME

CROSS REFERENCE TO RELATED APPLICATION

This application claims the benefit of Korean Patent Application No. 10-2010-0056029, filed on Jun. 14, 2010, entitled "Heat-Radiating Substrate And Manufacturing Method Thereof", which is hereby incorporated by reference in its entirety into this application.

BACKGROUND OF THE INVENTION

1. Technical Field

The present invention relates to a heat-radiating substrate and a method of manufacturing the same.

2. Description of the Related Art

Recently, there has been an effort to manufacture heat-radiating substrates in various shapes using a metal material having excellent thermal conductivity in order to solve the heat-radiation problem of a power device and a power module applied in various fields. At the same time, a radiating substrate on which multilayer fine patterns are formed has also been requested in other product fields as well as a LED module and a power module.

However, in the case of the heat-radiating substrate according to the prior art including an organic PCB, a ceramic substrate, a glass substrate or a metal core layer, it is relatively difficult to form a fine pattern as compared to a case of a silicon wafer and the cost is high, such that the application field thereof has been limited. Therefore, a study on a heat-radiating substrate has recently progressed in order to maximally discharge the heat of a heat generating element using anodizing.

FIG. 1 is a cross-sectional view of a heat-radiating substrate according to the prior art, and FIG. 2 is a plan view of the heat-radiating substrate of FIG. 1. Hereinafter, the heat-radiating substrate and the method of manufacturing the same according to the prior art will be described with reference to FIGS. 1 and 2.

First, anodizing is performed on a metal core 11 to form an insulating layer 12.

Then, a circuit layer 13 is formed on the insulating layer 12.

Then, electronic device including a heat generating element 14 and a thermally weakened element 15 is positioned on the insulating layer 12 on which the circuit layer 13 is formed.

In the prior art, the heat-radiating substrate has been manufactured through the process as described above.

In the case of the heat-radiating substrate according to the prior art, it has a great effect of heat transfer of metal, such that the heat generated from the heat generating element 14 is discharged to the outside through the insulating layer 12 and a metal core 11. Therefore, the heat generating element 14 formed on the heat-radiating substrate is not applied with high heat, thereby making it possible to prevent the performance of the heat generating element 14 from being degraded.

In the case of the heat-radiating substrate according to the prior art, however, a problem arises in that the heat generated from the heat generating element 14 is transferred to the thermally weakened element 15 formed on the insulating layer 12 through the insulating layer 12 and the metal core 11. In addition, when the heat generated from the heat generating element 14 is applied to the thermally weakened element 15, the performance of the thermally weakened element 15 is degraded or changed, and when the heat is very high, it leads to destruction of the thermally weakened element 15 to degrade reliability of the entirety of a product.

SUMMARY OF THE INVENTION

The present invention has been made in an effort to provide a heat-radiating substrate capable of protecting a thermally weakened element from the heat generated from a heat generating element, while maintaining heat-radiating characteristics, and a method of manufacturing the same.

A heat-radiating substrate according to a preferred embodiment of the present invention includes: a core layer including a core metal layer and a core insulating layer formed on the core metal layer and divided into a first region and a second region; a circuit layer formed in the first region of the core layer; a build-up layer formed in the second region of the core layer and including a build-up insulating layer and a build-up circuit layer; an adhesive layer formed between the second region of the core layer and the build-up layer; and an impregnation device mounted on the build-up layer to be impregnated into the adhesive layer.

Herein, the core insulating layer is formed by anodizing the core metal layer.

Further, the core metal layer includes aluminum, and the core insulating layer includes alumina formed by anodizing the core metal layer.

Further, the heat-radiating substrate further includes: a heat generating element mounted on the circuit layer in the first region; and a thermally weakened element mounted on the build-up layer in the second region Further, the heat generating element is an insulated gate bipolar transistor (IGBT) or a diode, and the thermally weakened element is a driver IC.

Further, the impregnation device is a passive device.

Further, the adhesive layer is made of prepreg (PPG).

Further, the circuit layer is formed on both surfaces of the core layer and further includes a via penetrating through the core layer to electrically connect the circuit layers on both surfaces.

Further, the heat-radiating substrate further includes a seed layer formed between the first region of the core layer and the circuit layer.

Further, the core layer is formed with a cavity on which the adhesive layer is mounted or the adhesive layer and the build-up layer are mounted.

A method of manufacturing a heat-radiating substrate according to a preferred embodiment of the present invention includes: (A) forming a circuit layer in a first region of a core layer including a core metal layer and a core insulating layer formed on the core metal layer and divided into the first region and a second region; (B) preparing a build-up layer including a build-up insulating layer and a build-up circuit layer; (C) mounting an impregnation device on the build-up layer; and (D) bonding the second region of the core layer to the build-up layer by interposing an adhesive layer between the second region of the core layer and the build-up layer so that the impregnation device is impregnated into the adhesive layer.

At this time, at step (A), the core insulating layer is formed by anodizing the core metal layer.

Further, step (A) includes: (A1) providing a core metal layer including aluminum; (A2) preparing a core layer divided into a first region and a second region by forming a core insulating layer including alumina on the core metal layer by anodizing the core metal layer; and (A3) forming a circuit layer in the first region of the core layer.

Further, the method of manufacturing a heat-radiating substrate further includes (E) mounting a heat generating element on the circuit layer in the first region and mounting a thermally weakened element on the build-up layer in the second region.

Further, the heat generating element is an insulated gate bipolar transistor (IGBT) or a diode, and the thermally weakened element is a driver IC.

Further, the impregnation device is a passive device.

Further, at step (D), the adhesive layer is made of prepreg (PPG).

Further, step (A) includes: (A1) forming a through hole in the core metal layer; (A2) preparing the core layer divided into the first region and the second region by forming the core insulating layer on the surface of the core metal layer including the inner walls of the through hole; and (A3) forming the circuit layer electrically connected by the via in the first region of both surfaces of the core layer, simultaneously forming the via in the through hole.

Further, step (A) includes: (A1) preparing the core layer including the core metal layer and the core insulating layer formed on the core metal layer and divided into the first region and the second region; (A2) forming a seed layer on the core layer; (A3) forming the patterned circuit layer on the seed layer formed in the first region of the core layer; and (A4) removing the seed layer exposed to the outside.

Further, step (A) includes: (A1) forming a cavity in the core metal layer; (A2) preparing the core layer divided into the first region and the second region in which the cavity is formed by forming the core insulating layer on the core metal layer including the cavity; and (A3) forming the circuit layer in the first region of the core layer.

DESCRIPTION OF THE PREFERRED EMBODIMENTS

Figure 1:
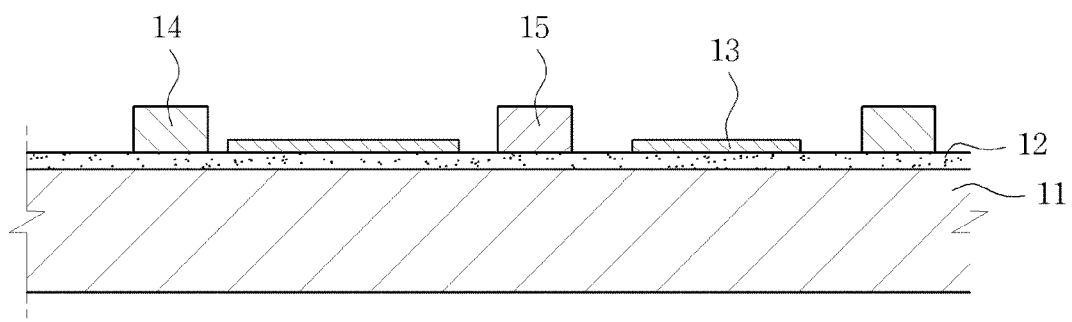
FIG. 1 is a cross-sectional view of a heat-radiating substrate according to the prior art.
Figure 2:
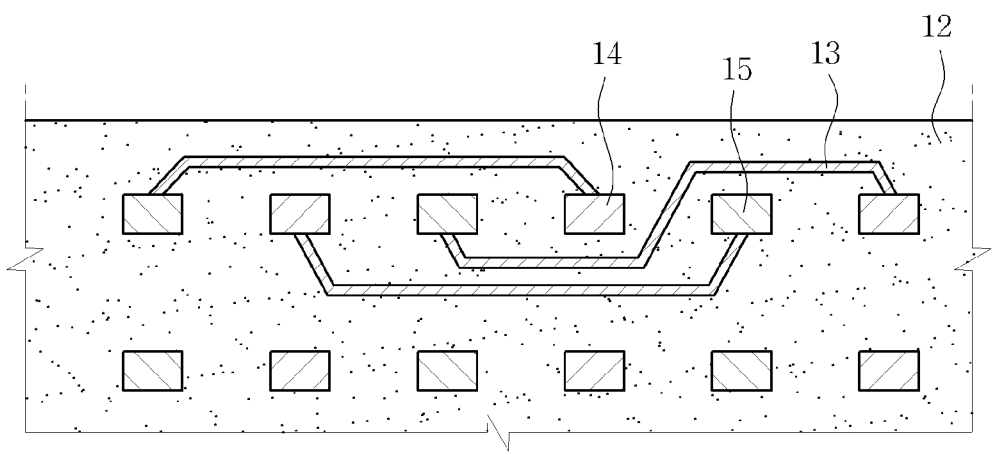
FIG. 2 is a plan view of the heat-radiating substrate of FIG. 1.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

Various objects, advantages and features of the invention will become apparent from the following description of embodiments with reference to the accompanying drawings. In the specification, in adding reference numerals to components throughout the drawings, it is to be noted that like reference numerals designate like components even though components are shown in different drawings. Further, terms used in the specification, 'first', 'second', etc. can be used to describe various components, but the components are not to be construed as being limited to the terms. The terms are only used to differentiate one component from other components. Further, when it is determined that the detailed description of the known art related to the present invention may obscure the gist of the present invention, the detailed description thereof will be omitted.

Hereinafter, preferred embodiments of the present invention will be described in detail with reference to the accompanying drawings.

Structure of Heat-Radiating Substrate

Figure 3:
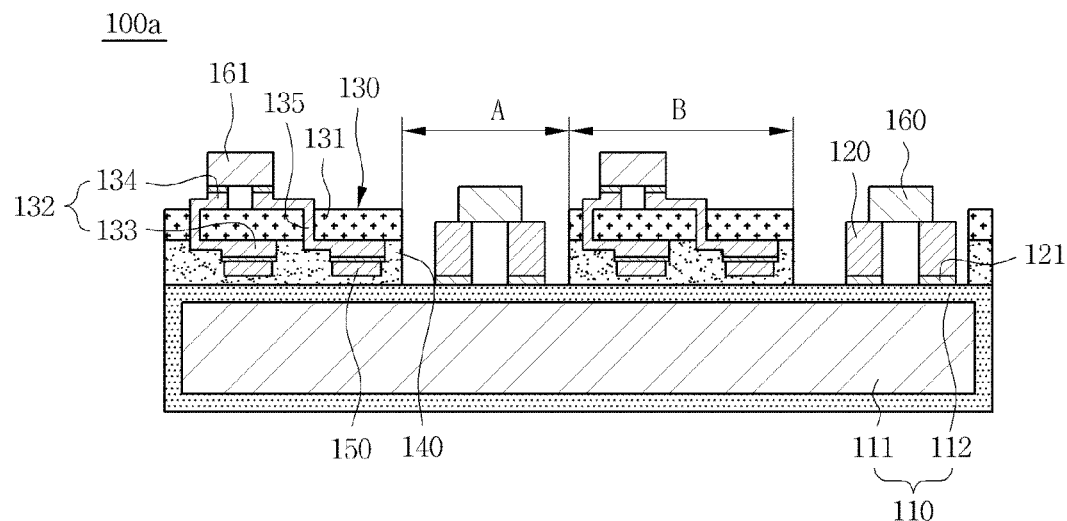
FIG. 3 is a cross-sectional view of a heat-radiating substrate according to a first preferred embodiment of the present invention.

FIG. 3 is a cross-sectional view of a heat-radiating substrate 100a according to a first preferred embodiment of the present invention. Hereinafter, the heat-radiating substrate 100a according to the present embodiment will be described with reference to the figure.

As shown in FIG. 3, the heat-radiating substrate 100a according to the present embodiment includes a heating part and a thermally weakened part. The heating part includes a core layer 110 and a circuit layer 120 formed in the first region A of the core layer 110, and the thermally weakened part includes a build-up layer 130 bonded to the second region B of the core layer 110 through an adhesive layer 140, such that the heating part is thermally separated form the thermally weakened part and an impregnation device 150 impregnated into the adhesive layer 140 is formed on the build-up layer 130.

The core layer 110 includes a core metal layer 111 and a core insulating layer 112 and discharges the heat generated from a heat generating element 160 to the outside.

Herein, the core metal layer 111 is a portion to be a base of the core layer 110. The core metal layer 111 is made of metal, such that it may have an excellent heat-radiation effect. The core metal layer 111 is also made of metal to have large strength as compared to the core layer made of general resin. Therefore, the core metal layer 111 may have a large resistance against warpage. Meanwhile, in order to maximize a heat-radiation effect, the core metal layer 111 may use metal having an excellent thermal conductivity, for example, aluminum (Al), nickel (Ni), magnesium (Mg), titanium (Ti), zinc (Zn), tantalum (Ta), or an alloy thereof.

The core insulating layer 112 is a member to be formed on one surface, both surfaces, or the entire surface of the core metal layer 111. The core insulating layer 112 serves to insulate the circuit layer 120 not to be short-circuited with the core metal layer 111. Herein, in order to maximize a heat-radiation effect, the core insulating layer 112 may be formed by anodizing the core metal layer 111. When the core metal layer 111 includes aluminum, the core insulating layer 112 may include alumina ($Al_2O_3$) anodizing thereof. When the core insulating layer 112 is formed by anodizing, in particular, when the core insulating layer 112 is formed by anodizing aluminum, a heat-radiation effect increases, such that the core layer 110 may not be required to be made thick.

Meanwhile, the core layer 110 is divided into a first region A and a second region B, wherein the circuit layer 120 may be formed in the first region A and the build-up layer 130 may be formed in the second region B.

The circuit layer 120 is a member to constitute the heating part, together with the core layer 110. The circuit layer 120 is formed in the first region A of the core insulating layer 112 of the core layer 110 to electrically connect the heat-radiating substrate 110a to the heat generating element 160.

Herein, the circuit layer 120 may be directly formed in the first region A of the core layer 110 to transfer the heat generated from the heat generating element 160 directly to the core layer 110. In addition, in order to maximize a heat-radiation effect, the circuit layer 120 may be formed to be wide in a pad shape rather than in a wire shape. At this time, the circuit layer 120 electrically connects the heat-radiating substrate 110a to the heat generating element 160. Therefore, the circuit layer 120 may be made of conductive metal, such as gold, silver, copper, nickel or the like, while being patterned.

A seed layer 121 may be further formed between the circuit layer 120 and the first region A of the core layer 110. The seed layer 121 is formed to be thin between the circuit layer 120 and the first region A of the core layer 110, thereby making it possible to provide convenience during the process of forming the circuit layer 120. The seed layer 121 may also be patterned in the same pattern as the circuit layer 120.

Meanwhile, the circuit layer 120 may be formed on both surfaces as well as one surface of the core layer 110. At this time, a via (not shown) penetrating through the core layer 110 to connect the circuit layers (not shown) formed on both surfaces may further be formed in the core layer 110. In this case, the core insulating layer 112 may be formed between the via (not shown) and the core metal layer 111 so that the via (not shown) is not short-circuited with the core metal layer 111.

The build-up layer 130 is a member that is formed in the portion of the core layer 110, on which the circuit layer 120 is not formed, that is, the second region B, to constitute the thermally weakened part.

Herein, the build-up layer 130 may include a build-up insulating layer 131 and a build-up circuit layer 132. At this time, the build-up insulating layer 131 may be made of a composite polymer resin having low thermal conductivity and being commonly used as an interlayer insulating material. For example, the build-up insulating layer 131 may use prepreg (PPG), thereby making it possible to make the heat-radiating substrate 100a thinner. Alternatively, the build-up insulating layer 131 may use an Ajinomoto Build up Film (ABF), thereby making it possible to easily implement a fine circuit. Besides, the build-up insulating layer 131 may use epoxy-based resin such as FR-4, Bismaleimide Triazine (BT), or the like, but it is not particularly limited thereto.

In addition, the build-up circuit layers 132 may be formed on interlayer and both surfaces of the build-up insulating layer 131. Herein, the impregnation device 150 may be electrically connected to the first circuit layer 133 of the build-up circuit layer 132 on the outermost layer and the thermally weakened element 161 may be connected to the second circuit layer 134 thereof. In addition, the interlayer connection of the build-up circuit layer 132 may be made through a build-up via 135. The build-up circuit layer 132 may be made of a conductive metal, similar to the circuit layer 120.

Meanwhile, an adhesive layer 140 may be further formed between the build-up layer 130 and the second region B of the core layer 110. The adhesive layer 140 is a member that bonds the build-up layer 130 to the second region B of the core layer 110. The adhesive layer 140 may be made of, for example, prepreg having both adhesion and insulation. In addition, since the adhesive layer 140 is impregnated by the impregnation device 150, it is preferable that the adhesive layer 140 has a height higher than that of the impregnation device 150. The reason is that when the adhesive layer 140 has the same height as the impregnation device 150, the impregnation device 150 directly contacts the core layer 110 to be damaged by the heat generated from the heat generating element 160.

Meanwhile, even though FIG. 3 shows the case in which the build-up insulating layer 131 is configured of a single layer, the present invention is not limited thereto but may also include a case in which the build-up layer 130 includes a multilayered build-up insulating layer 131, a multilayered build-up circuit layer 132 and a build-up via 135 connecting the multilayered build-up circuit layers 132. In addition, the feature that the build-up layer 130 is formed on both surfaces of the core layer 110 may also fall under the scope of the present invention.

The impregnation device 150 is a member that is formed on the build-up layer 130 to be impregnated into the adhesive layer 140.

Herein, the impregnation device 150 may be electrically connected to the first circuit layer 133 of the build-up circuit layer 132 on the outermost layer to be impregnated into the adhesive layer 140 bonding the build-up layer 130 to the second region B of the core layer 110. In addition, the impregnation device 150 is a device that is relatively close to the core layer 110 and is thus not easily damaged by heat. For example, the impregnation device 150 may be a passive device such as a capacitor, a resistor, an inductor or the like.

The impregnation device 150 is formed on the build-up layer 130, while being impregnated into the adhesive layer 140, to use the heat-radiating substrate 100a three-dimensionally, thereby making it possible to increase efficiency of spatial utilization.

Meanwhile, the heat generating element 160 is mounted on the heating part and the thermally weakened element 161 is mounted on the thermally weakened part.

More specifically, the heat generating element 160 may be mounted on the heating part, that is, the circuit layer 120, and the thermally weakened element 161 may be mounted on the thermally weakened part, that is, the second circuit layer 134 of the build-up circuit layer on the outermost layer formed on the build-up layer 130. Herein, the heat generating element 160 is a device that generates a large amount of heat during the operation of the device. The heat generating element 160 may be, for example, an insulated gate bipolar transistor (IGBT) or a diode. The thermally weakened element 161 is a device of which function is easily degraded or changed by heat. The thermally weakened element 161 is a device that may degrade reliability of a product by being inoperable or causing a malfunction when it is heated. The thermally weakened element 161 may be, for example, a driver IC.

Meanwhile, when the heat generating element 160 is positioned on the heating part, the heat generated from the heat generating element 160 may be rapidly discharged through the core layer 110. In addition, the build-up insulating layer 131 of the build-up layer 130 and the adhesive layer 140 have a thermal conductivity not higher than the core insulating layer 112, such that the amount of heat generated form the heat generating element 160 to be transferred to the thermally weakened part is relatively small. Therefore, the thermally weakened element 161 on the thermally weakened part can be safely operated, not being damaged by the heat generated from the heat generating element 160. In other words, in the single heat-radiating substrate 110a, the heating part may be thermally separated from the thermally weakened part.

Meanwhile, the heat generating element 160 may be electrically connected to the heat-radiating substrate 100a through the circuit layer 120 and the thermally weakened element 161 may be connected to the heat-radiating substrate 100a through the second circuit layer 134 of the build-up circuit layer 132 on the outermost layer. However, they are not limited thereto but may be connected using a connection unit such as a wire, or the like. In addition, the circuit layer 120 and the build-up circuit layer 132 may be electrically connected to each other by a wire, or the like.

In order to adjust the height of the heat generating element 160 to that of the thermally weakened element 161 at a predetermined level, the circuit layer 120 may be formed to have a height higher than the build-up circuit layer 132. Therefore, the height difference between the thermally weakened part and the heating part due to the existence of the adhesive layer 140 and the impregnation device 150 in the thermally weakened part may be compensated to some extent.

Figure 4:
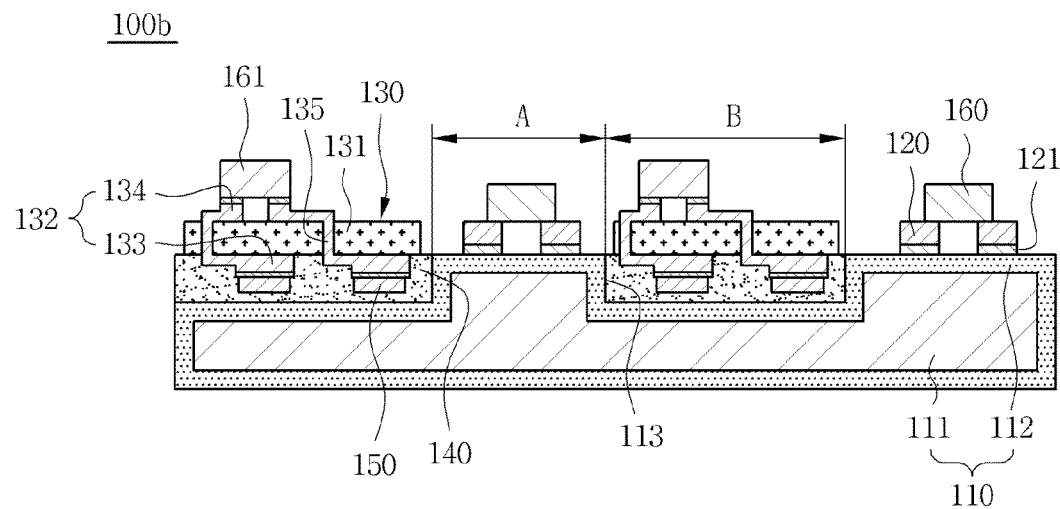
FIG. 4 is a cross-sectional view of a heat-radiating substrate according to a second preferred embodiment of the present invention.

FIG. 4 is a cross-sectional view of a heat-radiating substrate 100b according to a second preferred embodiment of the present invention. Hereinafter, the heat-radiating substrate 100b according to the present embodiment will be described with reference to the figure. Herein, like reference numerals will designate like or corresponding components and the description overlapping with the first embodiment will be omitted.

As shown in FIG. 4, the heat-radiating substrate 100b according to the present embodiment includes a heating part and a thermally weakened part, wherein the heating part and the thermally weakened part are thermally separated. An impregnation device 150 impregnated into an adhesive layer 140 is formed on a build-up layer 130, and in particular, a cavity 113 is formed in a core layer 110 so that the adhesive layer 140 or the adhesive layer 140 and the build-up layer 130 are mounted on the cavity 113.

A core layer 110 is divided into a first region A and a second region B, wherein a circuit layer 120 is formed in the first region A and the build-up layer 130 is bonded to the second region B through the adhesive layer 140.

Herein, the cavity 113 may be formed in the portion corresponding to the second region B of the core layer 110. More specifically, the cavity 113 may be formed in the core metal layer 111 and a core insulating layer 112 may be formed on the surface of the core metal layer 111 including the cavity 113. Meanwhile, the build-up layer 130 is bonded to the cavity 113 corresponding to the second region B of the core layer 110 through the adhesive layer 140. At this time, the cavity 113 may be formed to have a height equivalent to a portion or the entirety of the adhesive layer 140 or be formed to have a height equivalent to a portion or the entirety of the adhesive layer 140 and the build-up layer 130.

As the adhesive layer 140 and the build-up layer 130 are mounted on the cavity 113, it is possible to adjust the mounted height of the heat generating element 160 to that of the thermally weakened element 161 at a predetermined level. More specifically, since the build-up layer 130 may be positioned on a relatively lower position equal to the depth of the cavity 113, it is possible to adjust the height of the second circuit layer 134 of the build-up circuit layer 132 on the outermost layer to that of the circuit layer 120 formed in the first region A to some extent even though the circuit layer 120 is not formed to have a high height. In addition, since the thermally weakened element 161 is mounted on a relatively higher position as compared to the heat generating element 160, the mounted height of the build-up layer 130 is lowered by controlling the depth of the cavity 113, thereby making it possible to reduce the thickness of the entire heat-radiating substrate 100b.

Method of Manufacturing Heat-Radiating Substrate

FIGS. 5 to 11 are process cross-sectional views for explaining a method of manufacturing the heat-radiating substrate 100a of FIG. 3. Hereinafter, a method of manufacturing the heat-radiating substrate 100a according to a first preferred embodiment of the present invention will be described with reference to the figures.

Figure 5:
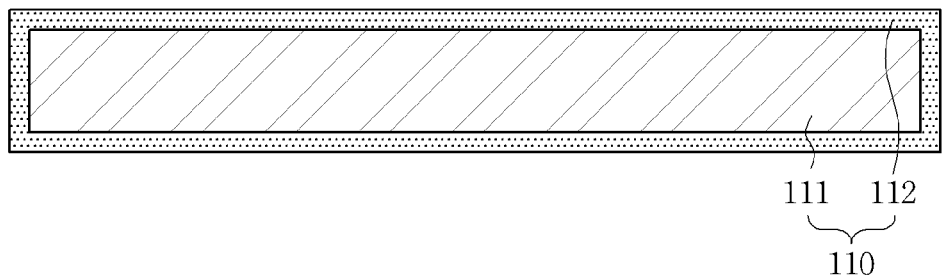
FIGS. 5 to 11 are process cross-sectional views for explaining a method of manufacturing the heat-radiating substrate of FIG. 3.

First, as shown in FIG. 5, the core layer 110 is prepared by forming the core insulating layer 112 on the core metal layer 111.

At this time, the core insulating layer 112 may be formed by anodizing the core metal layer 111, More specifically, the core metal layer 111 is connected to the positive terminal of a DC power supply to be immersed in an acid solution (an electrolyte), thereby making it possible to form the core insulating layer 112 configured of an anodized layer on the surface of the core metal layer 111. For example, when the core metal layer 111 includes aluminum, the surface of the core metal layer 111 reacts with the electrolyte (acid solution) to form aluminum ions $Al^{3+}$ on the interface thereof. Current density is concentrated on the surface of the core metal layer 111 by the voltage applied to the core metal layer 111 to locally generate heat, such that more aluminum ions are formed due to the heat. As a result, a plurality of grooves are formed in the surface of the core metal layer 111 and oxygen ions $O^{2-}$ move to the grooves due to force of an electric field to react with the electrolytic aluminum ions, thereby making it possible to form the core insulating layer 112 configured of an alumina layer.

Meanwhile, the through hole (not shown) may further be formed in the core layer 110. At this time, after forming the through hole (not shown) in the core metal layer 111, the core insulating layer 112 may be formed on one surface, both surfaces, or the entire surface of the core metal layer 111 including the inner walls of the through hole (not shown).

Figure 6:
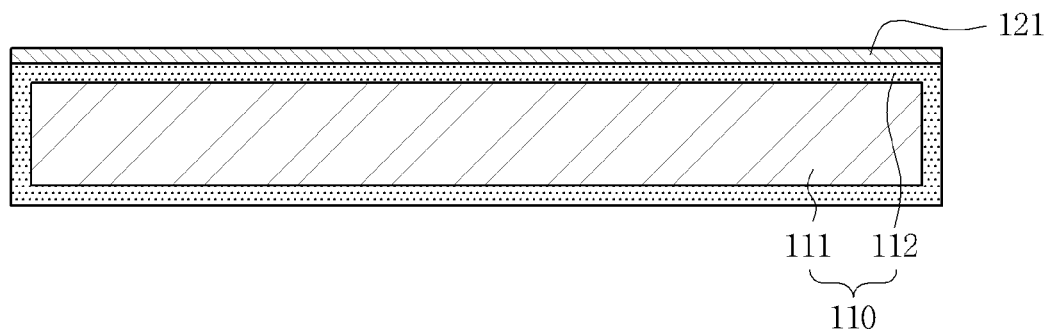

Then, as shown in FIG. 6, the seed layer 121 is formed on the core insulating layer 112.

At this time, the seed layer 121 may be formed on the entire surface of the core insulating layer 112 by an electroless process, such as a sputtering process. Meanwhile, when the through hole (not shown) is formed in the core layer 110, the seed layer 121 may also be formed in the inner walls of the through hole (not shown).

Figure 7:
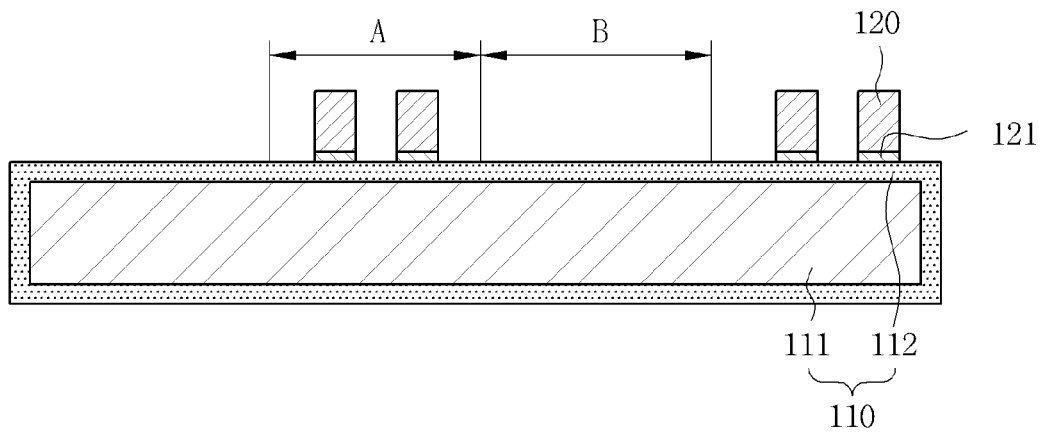

Then, as shown in FIG. 7, the circuit layer 120 is formed on the seed layer 121 formed in the first region A and the seed layer 121 exposed to the outside is removed.

At this time, the circuit layer 120 may be formed on the seed layer 121 formed in the first region A, while being patterned by, for example, a plating process. Further, a plating layer is also formed on the inner walls of the through hole (not shown) simultaneously with the plating process of the circuit layer 120, thereby making it possible to form the via (not shown) electrically connecting the circuit layers (not shown) formed on both surfaces of the core layer 110.

When the circuit layer 120 is patterned, the seed layer 121 exposed to the outside becomes unnecessary, such that the seed layer 121 may be removed by, for example, an etching process.

Meanwhile, even though the present embodiment describes that the circuit layer 120 is formed by a semi-additive process, the present invention is not limited thereto but may also include a case in which the circuit layer 120 is formed by a subtractive process, an additive process, or the like.

Figure 8:
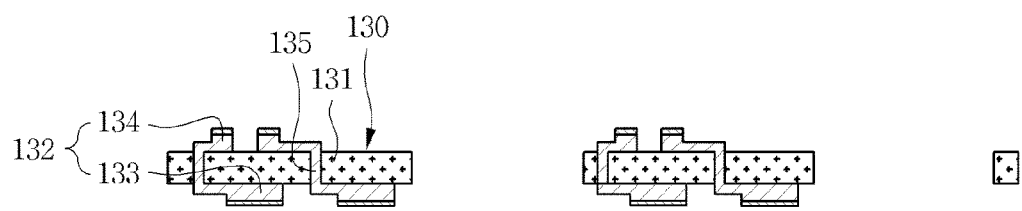

Then, as shown in FIG. 8, the build-up layer 130 is prepared.

At this time, the build-up insulating layer 131 and the build-up circuit layer 132 are configured of a single layer or a multilayer, and the build-up circuit layer 132 is formed on the outermost layer. Then, the impregnation device 150 and the thermally weakened element 161 can be mounted thereon, respectively. For example, when the build-up layer 130 is configured of a single layer, the build-up layer 130 is prepared in the following manner. First, the build-up insulating layer 131 is formed and the build-up circuit layers 132 on the outermost layer are formed on both surfaces of the build-up insulating layer 131. At this time, the build-up circuit layer 132 may be formed by, for example, a subtractive process, an additive process, a semi-additive process, a modified semi-additive process, or the like. In addition, the first circuit layer 133 and the second circuit layer 134 constituting the build-up circuit layer 132 on the outermost layer may be connected to each other through the build-up via 135. Then, several build-up layers 130 may be prepared by properly cutting the build-up layer 130.

Figure 9:
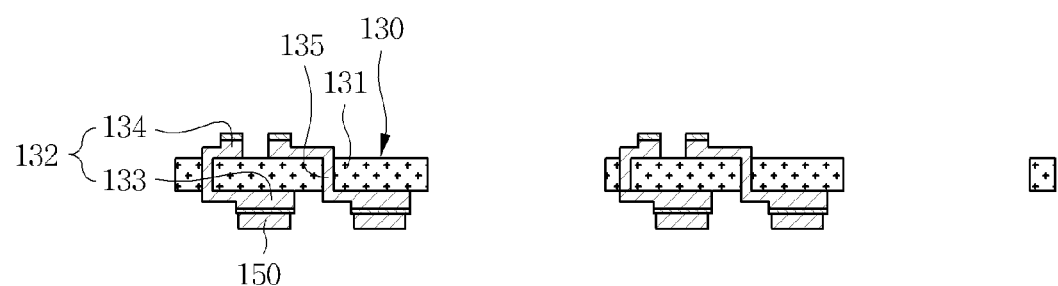

Then, as shown in FIG. 9, the impregnation device 150 is mounted on the first circuit layer 133 of the build-up layer 130.

At this time, the impregnation device 150 may be formed to be electrically connected to the first circuit layer 133. In addition, the impregnation device 150 may be a passive device having relatively less damage against heat.

Figure 10:
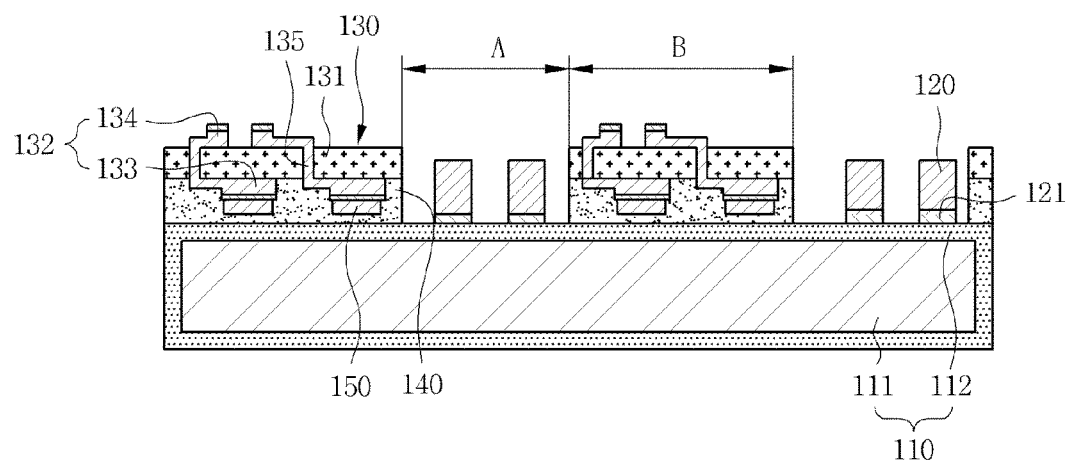

Then, as shown in FIG. 10, the build-up layer 130 is bonded to the second region B of the core layer 110 using the adhesive layer 140 so that the impregnation device 150 is impregnated into the adhesive layer 140.

At this time, the adhesive layer 140 is formed between the build-up layer 130 and the second region B of the core layer 110, thereby making it possible to bond the build-up layer 130 to the region of the core layer 110, on which the circuit layer 120 is not formed, that is, the second region B. Therefore, the heating part including the core layer 110 and the circuit layer 120 and the thermally weakened part including the build-up layer 130 can be thermally separated.

In addition, it is preferable that the adhesive layer 140 is made of a material having low thermal conductivity so that the heat generated from the heat generating element 160 is not transferred to the thermally weakened element 161, for example, prepreg (PPG).

Meanwhile, since the adhesive layer 140 is impregnated by the impregnation device 150 of the build-up layer 130, it is preferable that the adhesive layer 140 has a height higher than that of the impregnation device 150. When the adhesive layer 140 has a height higher than the impregnation device 150, the impregnation device 150 is spaced from the core layer 110, such that it may be less affected by the heat of the heat generating element 160.

Figure 11:
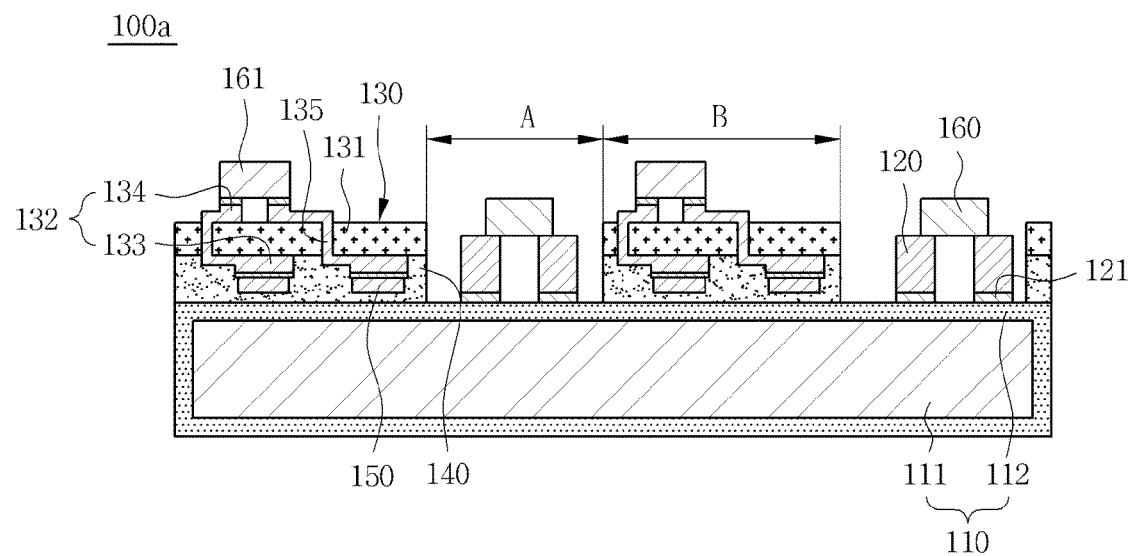

Then, as shown in FIG. 11, the heat generating element 160 is mounted on the circuit layer 120 and the thermally weakened element 161 is mounted on the second circuit layer 134 of the build-up circuit layer 132 on the outermost layer of the build-up layer 130.

The heat-radiating substrate 100a as shown in FIG. 11 according to a first preferred embodiment of the present invention is manufactured according to the manufacturing processes as described above.

FIGS. 12 to 18 are process cross-sectional views for explaining a method of manufacturing the heat-radiating substrate 100b of FIG. 4. Hereinafter, a method of manufacturing the heat-radiating substrate 100b according to a second preferred embodiment of the present invention will be described with reference to the figures. Herein, like reference numerals will designate like or corresponding components and the description overlapping with the first embodiment will be omitted.

Figure 12:
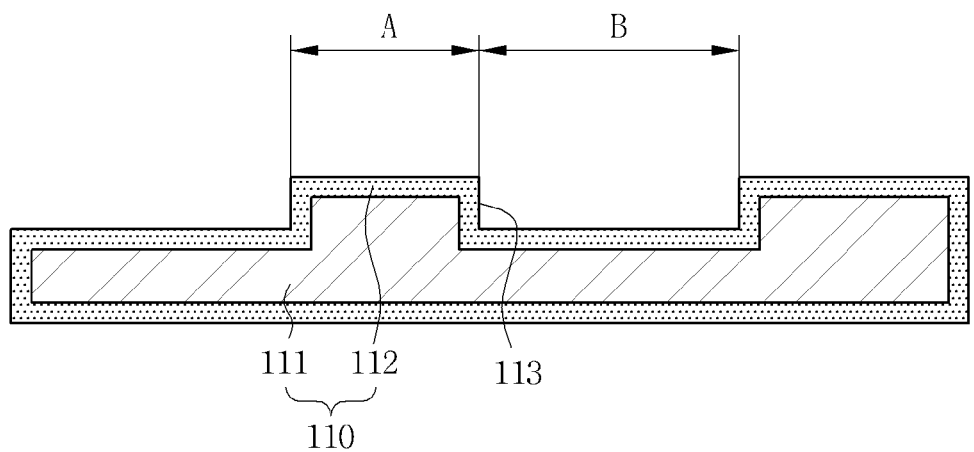
FIGS. 12 to 18 are process cross-sectional views for explaining a method of manufacturing the heat-radiating substrate of FIG. 4.

First, as shown in FIG. 12, the cavity 113 is formed in the core metal layer 111 and then the core insulating layer 112 is formed on the core metal layer 111 including the cavity 113, thereby preparing the core layer 110.

At this time, the cavity 113 corresponds to the region on which the adhesive layer 140, or the adhesive layer 140 and the build-up layer 130 are mounted, that is, the second region B of the core layer 110. In addition, since the circuit layer is not directly formed on the cavity 113, the core insulating layer 112 may not be formed on the portion of the cavity 113. However, it is preferable that the core insulating layer 112 is also formed on the cavity 113 in order to prevent the cavity 113 from being short-circuited with the impregnation device 150, or the like.

Figure 13:
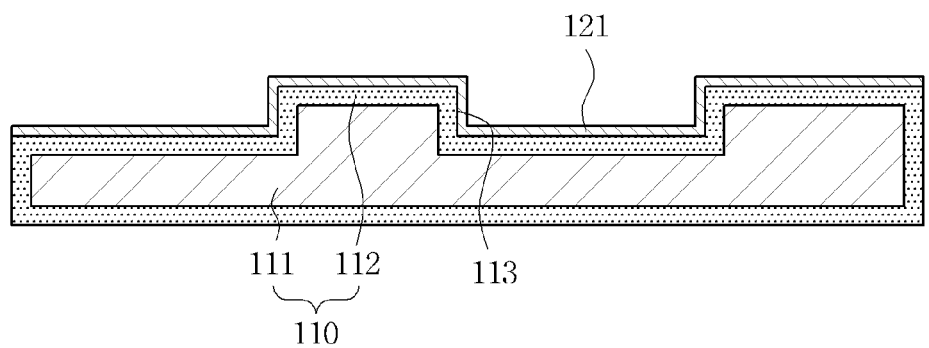
Figure 14:
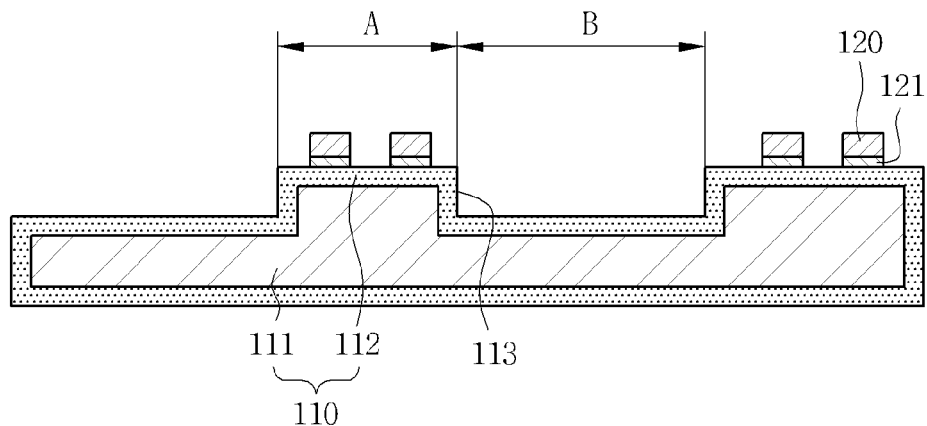

Then, as shown in FIGS. 13 and 14, after forming the seed layer 121 on the core layer 110 including the cavity 113, the circuit layer 120 is formed on the seed layer 121 formed in the first region A and then the unneeded seed layer 121 exposed to the outside is removed.

Figure 15:
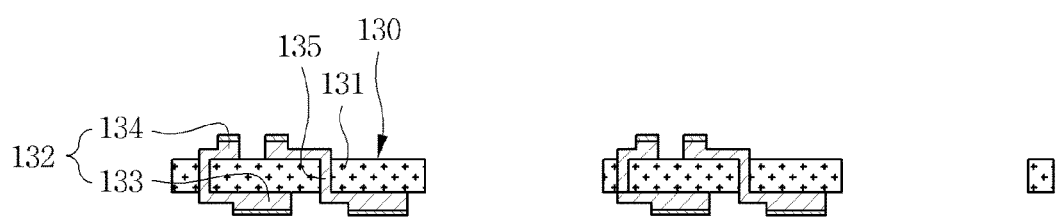
Figure 16:
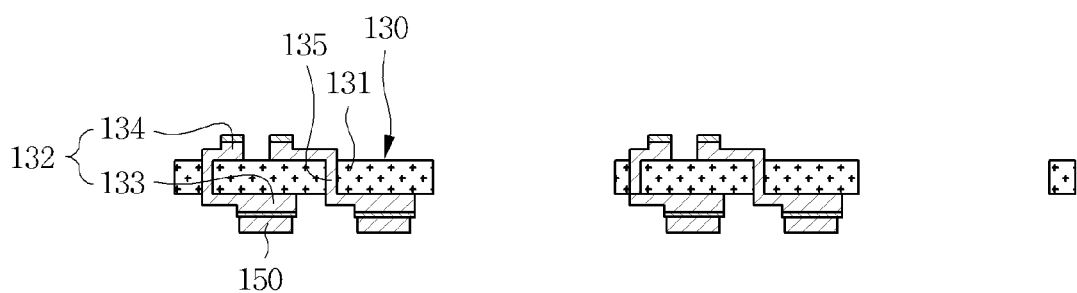

Then, as shown in FIGS. 15 and 16, the build-up layer 130 including the build-up insulating layer 131 and the build-up circuit layer 132 is formed, and the impregnation device 150 is mounted on the first circuit layer 133 of the build-up circuit layer 132 on the outermost layer.

Figure 17:
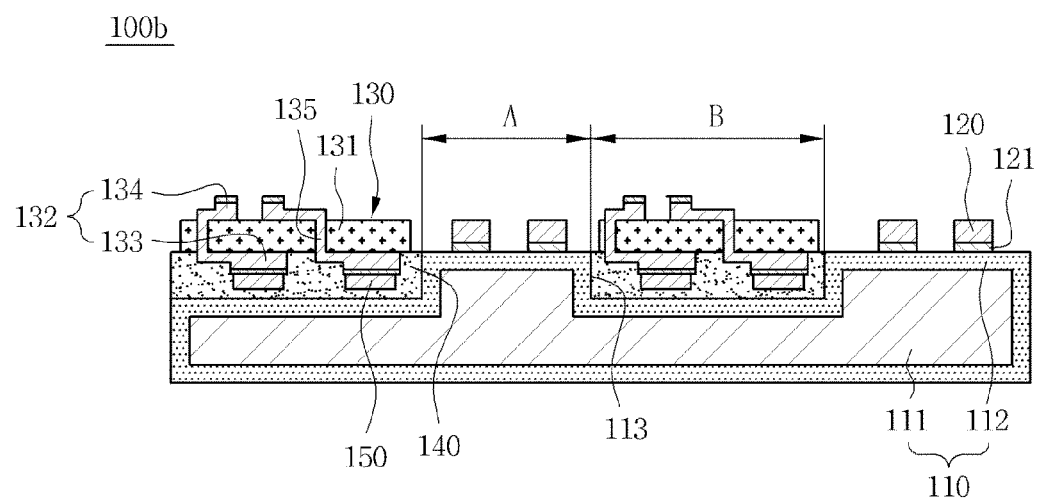

Then, as shown in FIG. 17, the build-up layer 130 is mounted on the second region B of the core layer 110, that is, the cavity 113, through the adhesive layer 140.

At this time, as the build-up layer 130 is mounted on the cavity 113, the position on which the build-up layer 130 is mounted becomes relatively low and accordingly, the height of the circuit layer 120 in the first region A may also become low, such that the height of the second circuit layer 134 of the build-up layer circuit layer 132 on the outermost layer of the build-up layer 130 and the height of the circuit layer 120 in the first region A may be adjusted at a predetermined level.

Figure 18:
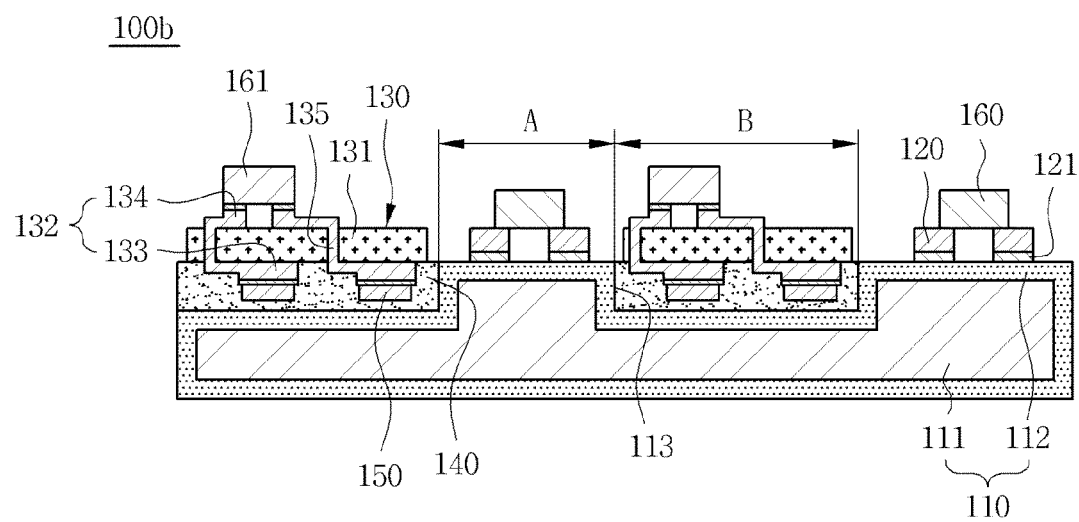

Then, as shown in FIG. 18, the heat generating element 160 is mounted on the circuit layer 120 and the thermally weakened element 161 is mounted on the second circuit layer 134 of the build-up circuit layer 132 on the outermost layer of the build-up layer 130.

The heat-radiating substrate 100b as shown in FIG. 18 according to a second preferred embodiment of the present invention is manufactured according to the manufacturing processes as described above.

With the heat-radiating substrate and a method of manufacturing the same according to the present invention, the heating part is thermally separated from the thermally weakened part, thereby maintaining the heat-radiation characteristics for the heat generating element mounted on the heating part and protecting the thermally weakened element mounted on the thermally weakened part from the heat of the heat generating element.

In addition, according to the present invention, the impregnation device is impregnated into the adhesive layer to use the heat-radiating substrate three-dimensionally, thereby increasing efficiency of spatial utilization.

In addition, according to the present invention, aluminum is used as the core metal layer and the alumina formed by anodizing the core metal layer is used as the core insulating layer to more rapidly discharge the heat generated from the heat generating element to the outside, thereby making it possible to make the core layer thinner.

In addition, according to the present invention, the build-up layer is mounted by forming the cavity in the second region of the core layer, thereby reducing the thickness of the entire heat-radiating substrate.

Although the preferred embodiments of the present invention have been disclosed for illustrative purposes, they are for specifically explaining the present invention and thus a heat-radiating substrate and a method of manufacturing the same according to the present invention are not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A heat-radiating substrate, comprising:
    a core layer including a core metal layer and a core insulating layer formed on the core metal layer and divided into a first region and a second region;
    a circuit layer formed in the first region of the core layer;
    a build-up layer formed in the second region of the core layer and including a build-up insulating layer and a build-up circuit layer;
    an adhesive layer formed between the second region of the core layer and the build-up layer; and
    an impregnation device mounted on the build-up layer to be impregnated into the adhesive layer.

2. The heat-radiating substrate as set forth in claim 1, wherein the core insulating layer is formed by anodizing the core metal layer.

3. The heat-radiating substrate as set forth in claim 1, wherein the core metal layer includes aluminum, and the core insulating layer includes alumina formed by anodizing the core metal layer.

4. The heat-radiating substrate as set forth in claim 1, further comprising:
    a heat generating element mounted on the circuit layer in the first region; and
    a thermally weakened element mounted on the build-up layer in the second region.

5. The heat-radiating substrate as set forth in claim 4, wherein the heat generating element is an insulated gate bipolar transistor (IGBT) or a diode, and the thermally weakened element is a driver IC.

6. The heat-radiating substrate as set forth in claim 1, wherein the impregnation device is a passive device.

7. The heat-radiating substrate as set forth in claim 1, wherein the adhesive layer is made of prepreg (PPG).

8. The heat-radiating substrate as set forth in claim 1, wherein the circuit layer is formed on both surfaces of the core layer and further includes a via penetrating through the core layer to electrically connect the circuit layers on both surfaces.

9. The heat-radiating substrate as set forth in claim 1, further comprising a seed layer formed between the first region of the core layer and the circuit layer.

10. The heat-radiating substrate as set forth in claim 1, wherein the core layer is formed with a cavity on which the adhesive layer is mounted or the adhesive layer and the build-up layer are mounted.

* * * * *